United States Patent
Cotte et al.

(10) Patent No.: US 8,426,316 B2
(45) Date of Patent: *Apr. 23, 2013

(54) TA-TAN SELECTIVE REMOVAL PROCESS FOR INTEGRATED DEVICE FABRICATION

(75) Inventors: John Michael Cotte, New Fairfield, CT (US); Nils Deneke Hoivik, Pleasantville, NY (US); Christopher Vincent Jahnes, Upper Saddle River, NJ (US); Robert Luke Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 646 days.

This patent is subject to a terminal disclaimer.

(21) Appl. No.: 12/204,412

(22) Filed: Sep. 4, 2008

(65) Prior Publication Data

US 2009/0001587 A1      Jan. 1, 2009

Related U.S. Application Data

(63) Continuation of application No. 11/064,561, filed on Feb. 24, 2005, now Pat. No. 7,422,983.

(51) Int. Cl.
*H01L 21/302* (2006.01)
*C23F 1/00* (2006.01)

(52) U.S. Cl.
USPC ........... 438/706; 438/689; 438/720; 438/738; 438/740; 216/58; 216/74

(58) Field of Classification Search ............... 438/689, 438/706, 720, 738, 740; 216/58, 74
See application file for complete search history.

(56) References Cited

U.S. PATENT DOCUMENTS

| | | | |
|---|---|---|---|
| 4,190,488 A | | 2/1980 | Winters |
| 5,968,847 A * | | 10/1999 | Ye et al. ............... 438/734 |
| 6,020,271 A * | | 2/2000 | Yanagida .............. 438/720 |
| 6,165,891 A | | 12/2000 | Chooi et al. |
| 6,207,570 B1 | | 3/2001 | Mucha |
| 6,465,888 B2 * | | 10/2002 | Chooi et al. .......... 257/751 |
| 6,482,748 B1 | | 11/2002 | Chen et al. |
| 6,635,185 B2 | | 10/2003 | Demmin et al. |
| 6,740,985 B1 * | | 5/2004 | Zhao ..................... 257/784 |
| 7,422,983 B2 * | | 9/2008 | Cotte et al. ............ 438/706 |
| 2001/0004538 A1 | | 6/2001 | Li et al. |
| 2004/0127049 A1 | | 7/2004 | Boardman et al. |
| 2006/0178004 A1 | | 8/2006 | Cotte et al. |
| 2009/0095713 A1* | | 4/2009 | Dimeo et al. ........... 216/58 |

OTHER PUBLICATIONS

U.S. Office Action dated May 13, 2011 issued in U.S. Appl. No. 11/871,504.

* cited by examiner

*Primary Examiner* — Shamim Ahmed
(74) *Attorney, Agent, or Firm* — Scully, Scott, Murphy & Presser, P.C.; Louis J. Percello, Esq.

(57) ABSTRACT

Disclosed are a method and a system for processing a semiconductor structure of the type including a substrate, a dielectric layer, and a TaN—Ta liner on the dielectric layer. The method comprises the step of using XeF2 to remove at least a portion of the TaN—Ta liner completely to the dielectric layer. In the preferred embodiments, the present invention uses XeF2 selective gas phase etching as alternatives to Ta—TaN Chemical Mechanical Polishing (CMP) as a basic "liner removal process" and as a "selective cap plating base removal process." In this first use, XeF2 is used to remove the metal liner, TaN—Ta, after copper CMP. In the second use, the XeF2 etch is used to selectively remove a plating base (TaN—Ta) that was used to form a metal cap layer over the copper conductor.

5 Claims, 8 Drawing Sheets

BEOL INTERCONNECT LEVEL PRIOR TO CMP

BEOL INTERCONNECT LEVEL AFTER COPPER CMP

BEOL INTERCONNECT LEVEL AFTER TaN-Ta CMP

BEOL INTERCONNECT LEVEL PRIOR TO CMP

BEOL INTERCONNECT LEVEL AFTER COPPER CMP

BEOL INTERCONNECT LEVEL AFTER XeF2 TaN-Ta REMOVAL

| MATERIAL | MEASURED PROPERTY AND ANY CHANGE NOTED | PRE XeF2 n-value - POST XeF2 n-value OR PRE AND POST SHEET RESISTANCE | DIELECTRIC CONSTANT |
|---|---|---|---|
| OMCTS (REACTOR 1) | NO SIGNIFICANT THICKNESS OR INDEX OF REFRACTION CHANGE (3.7um +/- 0.03um AND n= 1.36 +/-0.02 | 1.362 - 1.381 | POST - 3.18 |
| OMCTS (REACTOR 2) | NO SIGNIFICANT THICKNESS OR INDEX OF REFRACTION CHANGE (3.7um +/- 0.04um AND n= 1.36 +/-0.01 | 1.37 - 1.376 | PRE - 3.13 |
| NOVELLUS | NO SIGNIFICANT THICKNESS, INDEX OF REFRACTION OR DIELECTRIC CONSTANT CHANGE (0.24um +/-0.02um AND n= 1.43 +/-0.04, EPSILON 2.90 +/-0.03 | 1.409 - 1.483 | PRE 2.90 POST 2.93 |
| JSR | ATTACK OF Si THROUGH JSR. IN AREAS WHERE FILM DID NOT PEEL NO THICKNESS CHANGE | | |
| Cu | NO CHANGE IN SHEET RESISTANCE | PRE: 0.100 / POST 0.100 | |
| Ta | TOTALLY ETCHED | PRE: 10.23 / POST: 135 | SUBSTRATE #132 |
| TaN | TOTALLY ETCHED | PRE: 15.02 / POST 130 | SUBSTRATE #132 |
| CoWP | SURVIVED LONG EXPOSURES, ONLY 7% CHANGE IN SHEET RESISTANCE | PRE: 123 - 130 / POST: 130.141 | |
| TaN/Ru | NO VISUAL DEGRADATION | PRE: 0.34 / POST: 0.40 | |
| W | NO VISUAL DEGRADATION | PRE: 0.8 / POST: 1.1 | |

TABLE 1 - LIST OF LOW k MATERIALS AND METALS TESTED WITH XeF2

FIG. 3

BEOL INTERCONNECT LEVEL AFTER COPPER CMP AND
SELECTIVE ELECTROPLATED COBALT BASED CAP

BEOL INTERCONNECT LEVEL AFTER XeF2
REMOVAL OF TaN-Ta PLATING BASE/LINER

TA-TAN SELECTIVE REMOVAL PROCESS FOR INTEGRATED DEVICE FABRICATION

RELATED APPLICATIONS

This application is a continuation application of U.S. application Ser. No. 11/064,561, filed Feb. 24, 2005, now U.S. Pat. 7,422,983.

BACKGROUND OF THE INVENTION

1. Field of the Invention

This invention generally relates to integrated device fabrication; and more specifically, the invention relates to selective removal processes for integrated device fabrication. Even more specifically, the invention relates to processes that may be used effectively to remove selectively Ta—TaN layers or liners during the fabrication of an integrated device and that are compatible with low k dielectric materials.

2. Background Art

Generally, in the fabrication of integrated devices, various layers of materials, including copper and dielectric materials, are formed and patterned or etched to produce the desired end product. For example, Back-End-Of-Line (BEOL) interconnects are commonly fabricated using a combination of sequential layering and patterning of metal and dielectric films to produce an integrated multilevel wiring architecture for various semiconductor devices.

Advanced semiconductor devices typically require integrated interconnects with more inputs and outputs, greater current capacity, less signal delay and improved electrical noise characteristics. To this extent, BEOL interconnects have advanced by shrinking the cross-section of the wiring, increasing the levels of wiring, using better conductivity metals, and also reducing the intralevel capacitance by using low dielectric constant (low k) materials.

Of particular relevance is the implementation of low k materials in the BEOL structure. These materials have been extremely challenging to implement because they are mechanically weak and chemically sensitive to many of the processes used to integrate BEOL structures. Of particular concern is direct chemical mechanical polishing (CMP) of low k dielectrics, as is commonly required for copper damascene in silicon dioxide. Mechanical damage, water penetration and slurry incorporation can all cause permanent damage to the low k dielectric. Furthermore, some dielectric materials are used in BEOL devices as integration or reliability enhancement layers and are detrimental to maintaining a low k BEOL structure. It is therefore necessary to discover new processes and integration techniques that are compatible with low k materials to facilitate integration of low k materials into BEOL structures.

SUMMARY OF THE INVENTION

An object of this invention is to improve processes for fabricating integrated devices.

Another object of this invention is to provide improved processes and integration techniques that are compatible with low k dielectric materials to facilitate integration of low k materials into BEOL structures.

A further object of the present invention is to use XeF2 selective gas phase etching as alternatives to Ta—TaN chemical mechanical polishing in the fabrication of integrated circuit devices.

These and other objectives are attained with a method and system for processing a semiconductor structure of the type including a substrate, a dielectric layer, and a TaN—Ta liner on the dielectric layer. The method comprises the step of using XeF2 to remove at least a portion of the TaN—Ta liner completely to the dielectric layer. In the preferred embodiments, the present invention uses XeF2 selective gas phase etching as alternatives to Ta—TaN Chemical Mechanical Polishing (CMP) as a basic "liner removal process" and as a "selective cap conductive plating base removal process."

In this first use, XeF2 is used to remove the metal liner, TaN—Ta, after copper CMP to minimize mechanical stressing of the low k material and chemical alteration of the low k dielectric material, and to improve planarity after CMP. In the second use, the XeF2 etch is used to selectively remove a plating base (TaN—Ta) that was used to form a metal cap layer over the copper conductor. In this use, the metal cap allows the elimination of a high k dielectric cap normally required to prevent diffusion of copper into the interconnect dielectric.

Further benefits and advantages of the invention will become apparent from a consideration of the following detailed description, given with reference to the accompanying drawings, which specify and show preferred embodiments of the invention.

BRIEF DESCRIPTION OF THE DRAWINGS

FIG. 3 is a table showing various measurements of several materials subjected to XeF2 exposure.

DETAILED DESCRIPTION OF THE PREFERRED EMBODIMENTS

The present invention, generally, relates to methods and systems for processing semiconductor devices. More specifically, the invention relates to processes for removing or etching metals or metal layers, such as Ta—TaN, and that are compatible with low-k dielectric materials. This, in turn, allows or facilitates the use of low k dielectric materials for various applications in semiconductor devices, in which applications it has heretofore been difficult to use such dielectric materials.

Figure 1A:
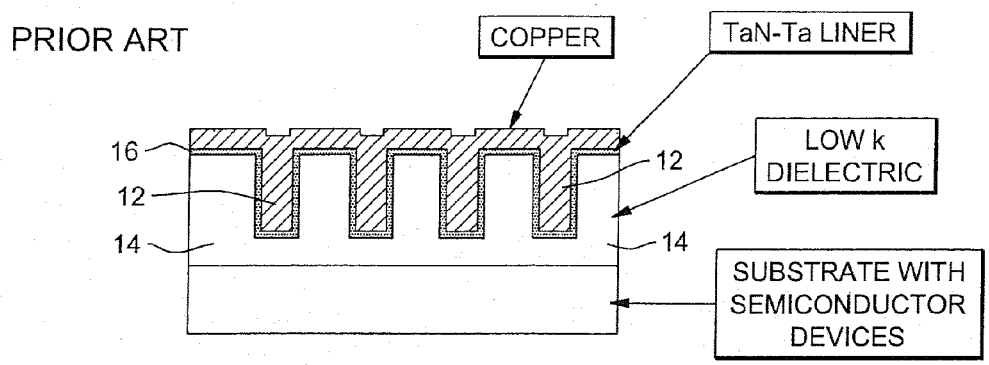
FIGS. 1A-1C show a current fabrication process for a BEOL interconnect structure.
Figure 1B:
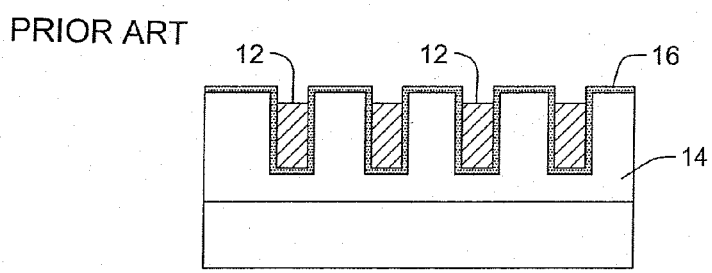
Figure 1C:
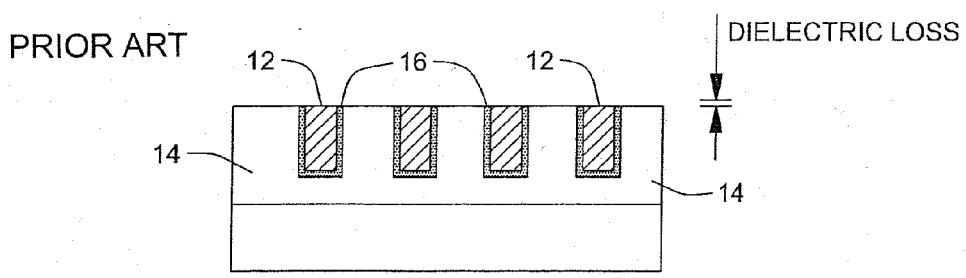

The challenges and difficulties of using these low-k dielectric materials in semiconductor devices are illustrated in FIGS. 1A-1C. With reference to these Figures, copper wire traces 12 are formed in a dielectric 14 using copper damascene CMP. To maintain planarity, it is ideal if the CMP process is highly selective in all phases of the CMP. It first needs to polish the copper with high selectivity to the TaN—Ta liner 16.

Following the copper CMP, the liner 16 is then polished, and this polish must be selective to both copper and the dielectric. This process has been shown to work well for conventional dielectric materials such as SiO2; however, when low k films are used, severe dielectric loss, mechanical degradation, and in some cases chemical modification of the low k material commonly occur.

Figure 2A:
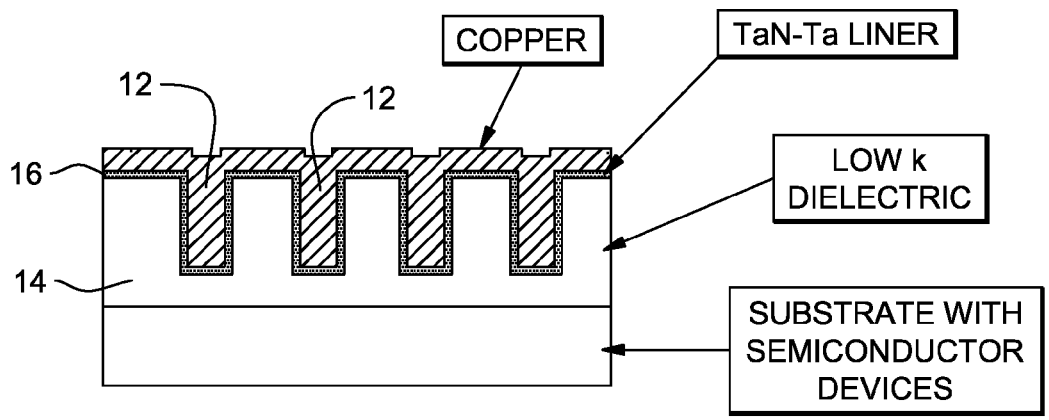
FIGS. 2A-2C illustrate a first embodiment of this invention, in which XeF2 is used to remove a TaN—Ta liner.
Figure 2B:
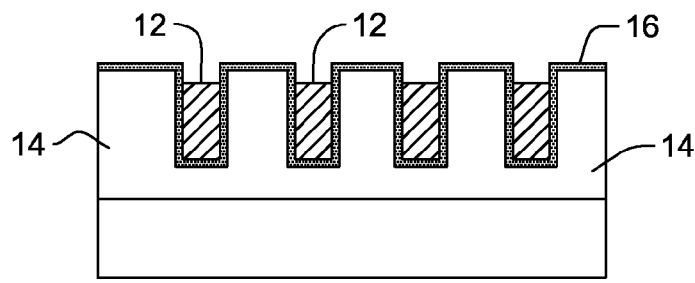
Figure 2C:
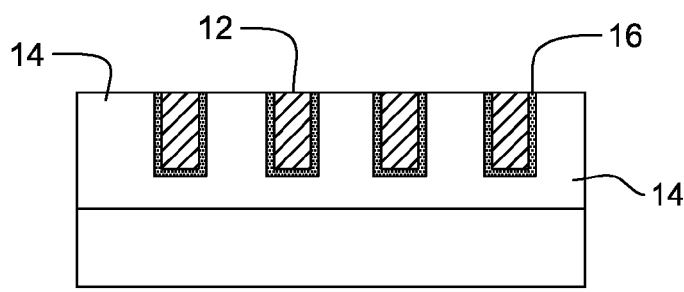

Shown in FIGS. 2A to 2C is a novel integration process that uses a copper CMP followed by the XeF2 TaN—Ta removal. The XeF2 liner removal process minimizes mechanical degradation of the structure, minimizes chemical modification of the structure, and minimizes the loss of the low-k dielectric 14. As can be seen, the XeF2 process results in preserving all the low-k dielectric, FIG. 2C, while the all CMP process of FIG. 1C has some dielectric loss.

To evaluate this application of XeF2, we have tested the compatibility of a range of materials to excessively long XeF2 exposures (thousands of seconds as compared to tens of seconds required). Materials such as SiO2, SiN, low k Si—C—O—H based materials, TaN—Ta and copper were tested and relevant measurements were performed to examine changes in these films. This data is shown in table 1 of FIG. 3.

Figure 4A:
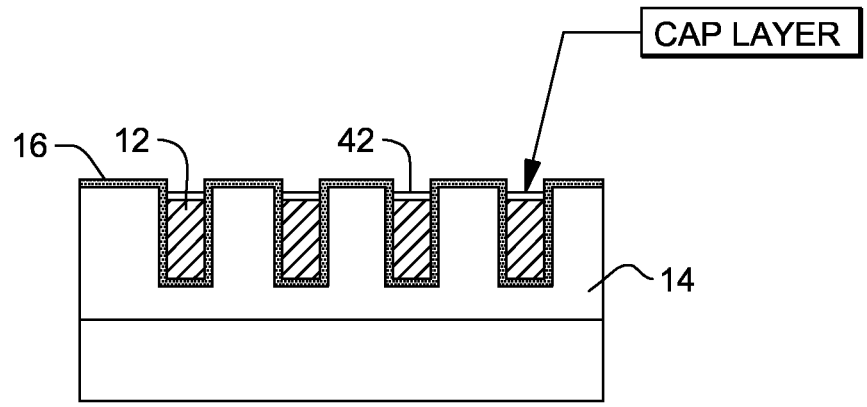
FIGS. 4A and 4B show a second embodiment of the invention, in which XeF2 is used to remove a TaN—Ta plating base/liner.
Figure 4B:
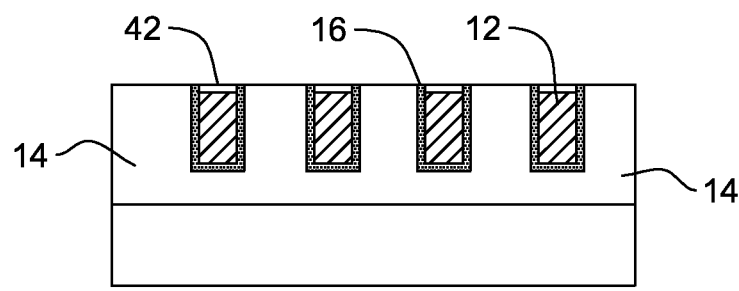

In a second embodiment, illustrated in FIGS. 4A and 4B, the XeF2 etch is used to remove a plating base required for selective metal cap 42 formation over the copper conductor 12. This process has been tested to show that only the plating base is etched and the metal cap 42 and surrounding dielectric 14 are preserved. Long XeF2 etch tests with cobalt based cap layers showed only a 7% sheet resistance increase which could be due to some impurity incorporation on the surface or a 7% thickness loss.

Furthermore, we have also tested the compatibility of XeF2 with copper and found that no etching occurs.

In a third embodiment, the XeF2 etch is used to remove the plating base/liner for a non-planar structure fabricated by through mask plating or by the combination of damascene and through mask plating. A high performance thick copper inductor is a typical example of a device that could be fabricated in this manner.

FIGS. 5A-5H depict the combined process flow that results in a non-planar structure, which renders plating base/liner removal by CMP impossible. In accordance with the third embodiment of the invention, the selective removal of the TaN/Ta plating base/liner can be done either directly after resist strip or following selective passivation of the exposed copper.

Figure 5A:
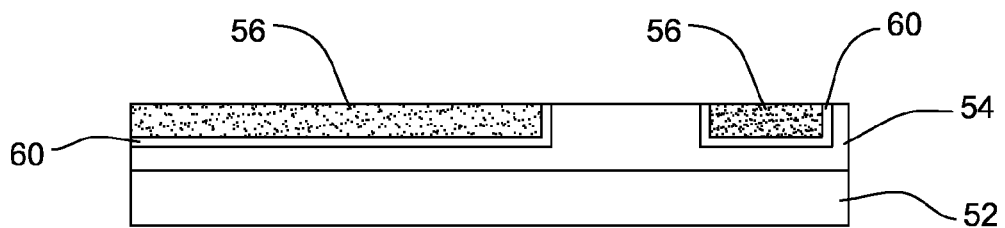
FIGS. 5A-5I illustrate a third embodiment of the invention, in which XeF2 is used to remove a TaN—Ta liner formed in the process of making copper coils on a semiconductor device.

FIG. 5A shows a starting structure BEOL interconnect on a semiconductor device. More specifically, FIG. 5A shows a substrate 52 with semiconductor devices, dielectric material 54 on that substrate, and copper regions 56 embedded in the dielectric. TaN—Ta liners 60 separate these copper regions from the dielectric materials.

Figure 5B:
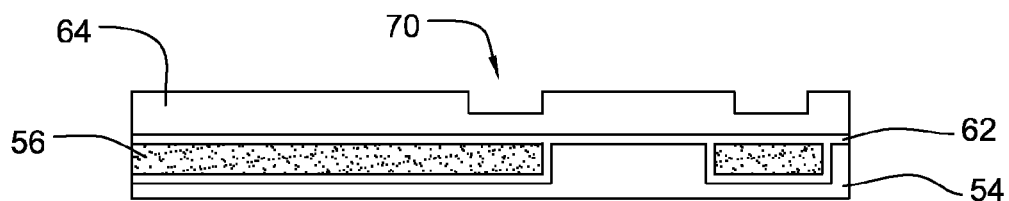

As indicated in FIG. 5B, a nitride cap 62 is formed over copper regions 56 and substrate 52, and additional dielectric material 64 is deposited on cap 62. Then, a first pattern 70 is etched partially into dielectric material 64.

Figure 5C:
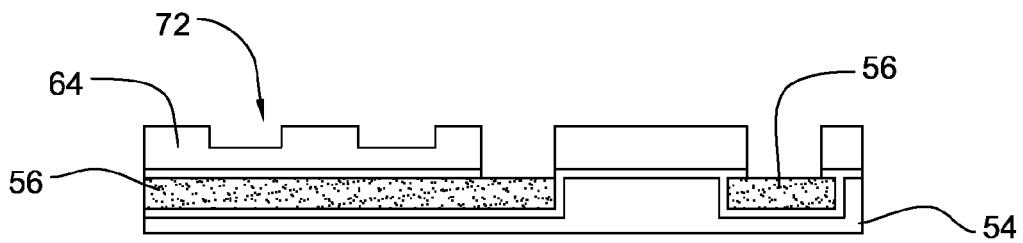
Figure 5D:
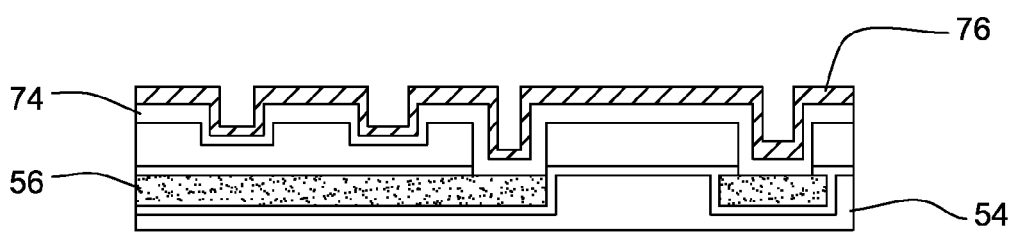
Figure 5E:
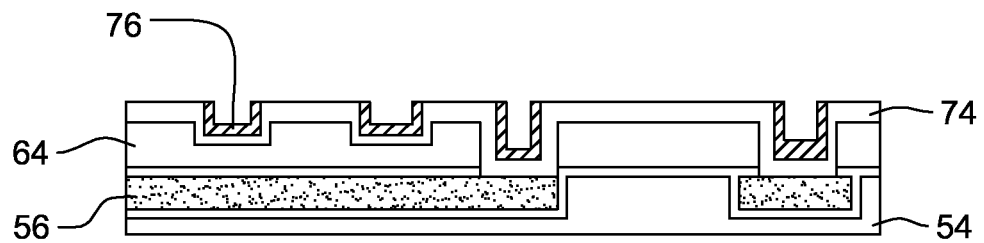
Figure 5F:
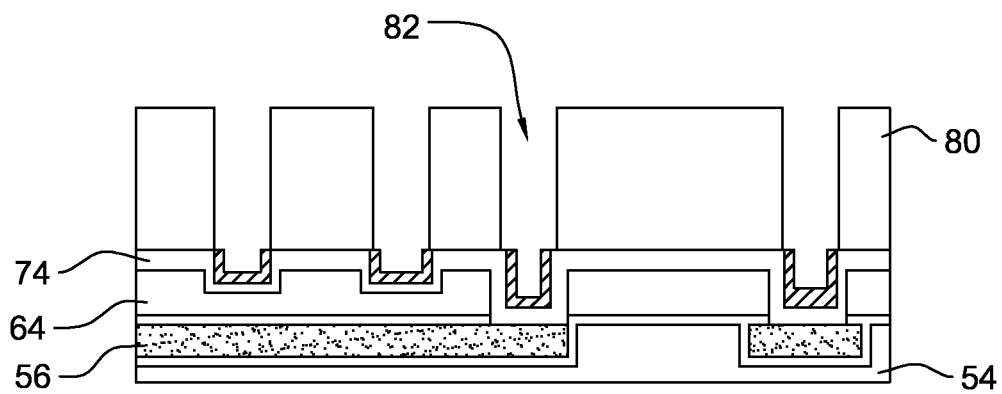
Figure 5G:
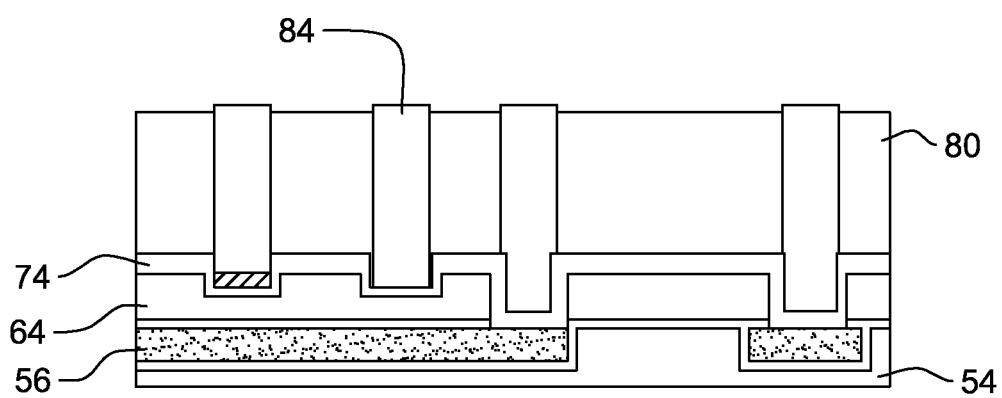

Then, with reference to FIG. 5C, a second pattern 72 is etched through portions of dielectric material 64, exposing selected areas of the dielectric 64 and of the copper regions 56. As shown in FIG. 5D, liner 74 and copper seed layer 76 are deposited over the patterned dielectric 64. Liner 74 is a TaN/Ta material. Next, portions, or the high points, of the copper seed 76 are removed, producing the structure shown in FIG. 5E, where specified portions of the TaN/Ta 76 are exposed. Then, as shown in FIG. 5F, a polymer mold 80, which covers the exposed TaN/Ta portions, is formed or placed on the structure. This mold 80 includes cavities or recesses 82, and, with reference to FIGS. 5F and 5G, an electroplating process is used to form copper extensions 84.

Figure 5H:
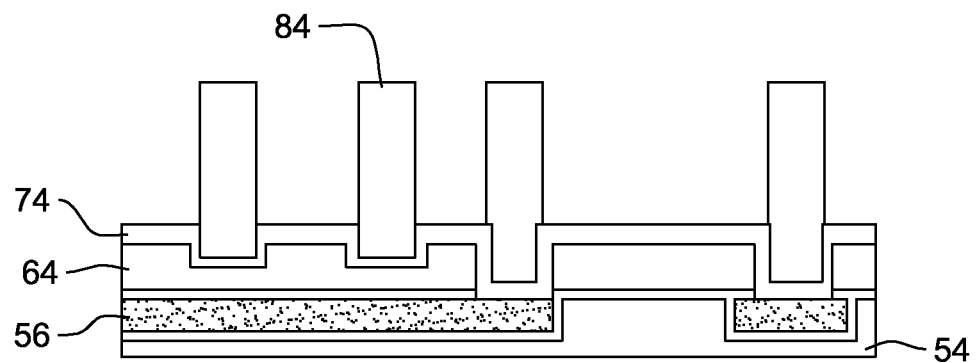
Figure 5I:
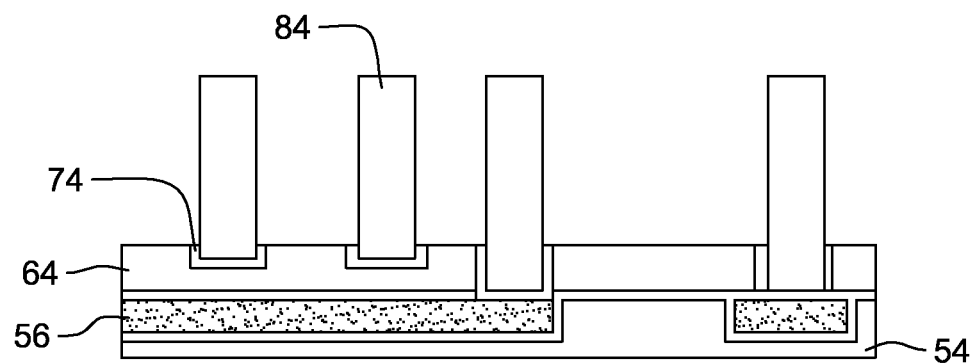

The polymer mold 80 is then removed, resulting in the structure of FIG. 5H. As can be seen, the top portions of this structure has a non-planar shape, and this makes it difficult to remove the exposed portions of the Ta/TaN liner 74 by means of a chemical mechanical polish. However, in accordance with the present invention, a XeF2 etch effectively removes those upper portions of the exposed Ta/TaN liner 74 without chemically altering or mechanically weakening dielectric layer, as shown in FIG. 5I.

Any suitable dielectric material may be used in the practice of this invention. For instance, as mentioned above, the material may be SiO2, SiN, or low k Si—C—O—H based materials. Also, preferably, the dielectric material has a dielectric constant below 4, and, for example, this material may have a dielectric constant between 1.2 and 4.

Figure 6:
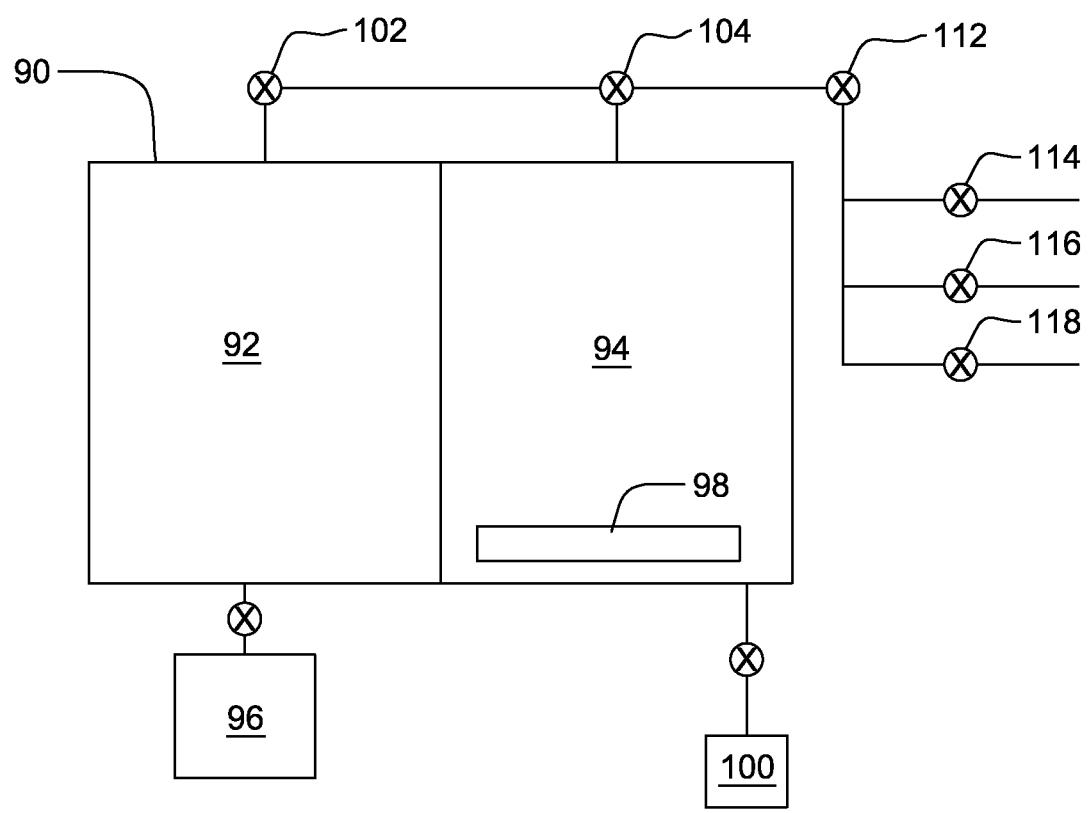
FIG. 6 shows a device that may be used to expose a semiconductor structure to XeF2.

Any suitable procedure may be employed to use the XeF2 to remove the Ta—TaN material from the semiconductor structure. For example, with reference to FIG. 6, a dual chamber, dual pressure device 90 may be used. Device 90 includes first and second chambers 92 and 94. Chamber 92 is at a low pressure such as, for instance, 0.5 to 2 or 3 Torr; and chamber 94 is at a lower pressure such as, for example, 0-20 a few m Torr.

A solid source form of XeF2, represented at 96, is exposed to the first chamber 92 through a valve 106; and the semiconductor structure, represented at 98, that is to be subjected to the XeF2 is placed in the second chamber 94. Valves 102 and 104 between the two chambers 92 and 94 are opened, and the XeF2 gas passes into the second chamber 94, thereby exposing semiconductor structure 98 to the XeF2. The semiconductor structure is exposed to the low pressure XeF2 for a defined period of time, such as one to one hundred seconds, and the XeF2 is then evacuated from chamber 94 through valve 110 into pump 100.

Chamber 94 may then be backfilled with nitrogen gas to help clean the XeF2 off the semiconductor structure 98 and to help ensure that the XeF2 is evacuated from chamber 94. Other gases may be diluted to the XeF2 or used in the backfill process to improve etch selectively or to help clean the semiconductor structure. These gases can be introduced into either chamber through valves 102, 104, 112, 114, 116 and 118. For instance, gases may be used to help displace water from the semiconductor structure. This backfill process may last, for example, from one to 10-20 seconds, and may be repeated. Additionally, substrate temperature control from 0° C. to 400° C. may be used to control chemical reactions on substrate 98.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of processing a semiconductor structure including a substrate, a dielectric layer, and a TaN—Ta liner on the dielectric layer, the method comprising the steps of:
    using a Chemical Mechanical Polishing (CMP) process to polish the semiconductor structure to expose areas of the TaN—Ta liner;
    providing a device having first and second chambers;
    establishing a first pressure in the first chamber and a second pressure in the second chamber, said first pressure being greater than said second pressure;
    conducting XeF2 into the first chamber;
    positioning the semiconductor structure in the second chamber;
    allowing XeF2 to pass from the first chamber to the second chamber; and exposing the semiconductor structure to the XeF2 in said second chamber after the CMP process to remove at least a portion of the TaN—Ta liner substantially completely to the dielectric layer while preserving all of the dielectric material; and wherein the CMP is finished before exposing the semiconductor structure to the XeF2 in order to remove the at least a portion of the TaN—Ta liner while reducing mechanical degradation, chemical modification and loss of the dielectric material by the CMP.

2. The method according to claim 1, wherein the semiconductor structure includes copper wire traces formed in the dielectric, and the using the Chemical Mechanical Polishing includes using the CMP to polish the copper wire traces and therein exposing areas of the TaN—Ta liner.

3. The method according to claim 2, wherein the exposing the semiconductor structure to the $XeF_2$ includes exposing the semiconductor structure to the $XeF_2$ in said second chamber after the CMP process, and in a manner that is selective to both the copper wire traces and the dielectric material, to remove at least a portion of the TaN—Ta liner substantially completely to the dielectric layer, while preserving all of the dielectric material.

4. The method according to claim 1, wherein the dielectric layer has a dielectric constant less than 4.0.

5. The method according to claim 1, comprising the further step of, after removing the at least a portion of the TaN—Ta liner substantially completely to the dielectric layer, filling said second chamber with nitrogen gas to help clean the XeF2 off the semiconductor structure.

* * * * *